(12) United States Patent
Koerner

(10) Patent No.: US 8,917,122 B1
(45) Date of Patent: Dec. 23, 2014

(54) FREQUENCY DIVIDERS

(71) Applicant: Infineon Technologies AG, Neubiberg (DE)

(72) Inventor: Heiko Koerner, Soeding (AT)

(73) Assignee: Infinion Technologies AG, Neubiberg (DE)

( * ) Notice: Subject to any disclaimer, the term of this patent is extended or adjusted under 35 U.S.C. 154(b) by 0 days.

(21) Appl. No.: 14/019,875

(22) Filed: Sep. 6, 2013

(51) Int. Cl.
*H03K 21/00* (2006.01)
*H03K 23/00* (2006.01)
*H03K 25/00* (2006.01)
*H03K 21/02* (2006.01)

(52) U.S. Cl.
CPC ................................ *H03K 21/026* (2013.01)
USPC .......................................... 327/115; 327/117

(58) Field of Classification Search
CPC . H03K 23/68; H03K 23/667; H03K 5/00006; G06F 7/68; G06F 1/08
USPC ................................................. 327/115, 117
See application file for complete search history.

(56) References Cited

U.S. PATENT DOCUMENTS

| 4,606,059 | A | * | 8/1986 | Oida | 377/47 |
| 5,214,681 | A | * | 5/1993 | Satoh | 377/47 |
| 2008/0164917 | A1 | * | 7/2008 | Floyd et al. | 327/117 |
| 2010/0225361 | A1 | * | 9/2010 | Rhee et al. | 327/105 |
| 2010/0253398 | A1 | * | 10/2010 | Seckin | 327/118 |
| 2011/0316597 | A1 | * | 12/2011 | Schnaitter et al. | 327/156 |
| 2012/0194220 | A1 | * | 8/2012 | Cavin | 326/104 |
| 2013/0278298 | A1 | * | 10/2013 | Curbelo et al. | 327/109 |
| 2014/0159781 | A1 | * | 6/2014 | Tourret | 327/117 |
| 2014/0184281 | A1 | * | 7/2014 | Danny et al. | 327/115 |

OTHER PUBLICATIONS

ECEN620: Network Theory Broadband Circuit Design Fall 2012, Lecture 17: Divider Circuits, Sam Palermo, Analog & Mixed-Signal Center, Texas A&M University.

\* cited by examiner

*Primary Examiner* — Adam Houston
(74) *Attorney, Agent, or Firm* — SpryIP, LLC

(57) ABSTRACT

Various embodiments relate to frequency dividers. A current of a current source of the frequency divider is controlled based on a property of an output signal of the frequency divider.

20 Claims, 5 Drawing Sheets

US 8,917,122 B1

FREQUENCY DIVIDERS

TECHNICAL FIELD

The present application relates to frequency dividers.

BACKGROUND

Frequency dividers generally are circuits which receive an input signal having a first frequency and in response thereto output an output signal having a second frequency, the second frequency corresponding to the first frequency divided by a divider factor. The divider factor may be an integer value (like 2, 3, 4 etc.), in which case the frequency divider is also referred to as integer divider. In other cases, the divider factor may be a non-integer value (for example 2.5), in which case the frequency divider is also referred to as fractional divider.

Such frequency dividers are used in a variety of circuits for example to generate clock signals having a predefined frequency (frequency synthesis) based on some reference clock source like a crystal oscillator. For example, for such frequency synthesis a phase-locked loop (PLL) may be used. In such PLLs, a reference signal, for example generated by a crystal oscillator or other stable oscillation source, is compared with a feedback signal. A result of the comparison is filtered and used to control an oscillator like a voltage-controlled oscillator (VCO) or a digitally controlled oscillator (DCO). An output signal of the oscillator is fed to a frequency divider to form the feedback signal. This for example may lead to an output frequency of the oscillator being regulated to a frequency value corresponding to the frequency of the reference signal times the divider factor. Also in other applications where frequencies need to be converted, frequency dividers may be used.

In such applications, for example frequency synthesis, reliable and precise operation of the frequency divider is required. In particular, for some applications it may be required that the frequency divider operates reliably over varying operating conditions like temperature or supply voltage. With some frequency divider designs, an accuracy or reliability of the frequency divider may depend on a current supplied to the frequency divider. On the other hand, for example in battery-powered mobile applications or other low power applications it is desirable to reduce the current consumed by a frequency divider.

DETAILED DESCRIPTION

In the following detailed description, various embodiments will be described with reference to the attached drawings. It should be noted that the embodiments as described herein and as shown in the attached drawings merely serve illustration purposes and are not to be construed as limiting the scope of the present application. For example, while embodiments may be described as comprising a plurality of features or elements, in other embodiments some of these features or elements may be omitted, and/or replaced by alternative features or elements. Also, in some further embodiments, additional features or elements may be provided.

In the described embodiments, any direct connection or coupling between elements or functional blocks may also be implemented by an indirect connection or coupling, i.e. a connection or coupling comprising one or more intervening elements, and vice versa as long as the general purpose of the connection or coupling, for example to transmit a certain information or signal, is still provided. Furthermore, features from different embodiments may be combined with each other unless specifically noted otherwise.

It should be noted that while embodiments may be depicted as consisting of various blocks or other functional elements, this does not necessarily imply that the various blocks or functional elements have to be implemented separately from each other, but they may also be implemented using a common circuit, for example a common integrated circuit.

Various embodiments relate to frequency divider circuits. In some embodiments, the frequency divider may comprise a current source like a bias current source. In some embodiments, the frequency divider may be implemented in current mode logic (CML). In embodiments, the current source (or a plurality of current sources) of the frequency divider is controlled based on a property of an output signal of the frequency divider, for example based on a duty cycle or integral of the output signal of the frequency divider.

Figure 1:
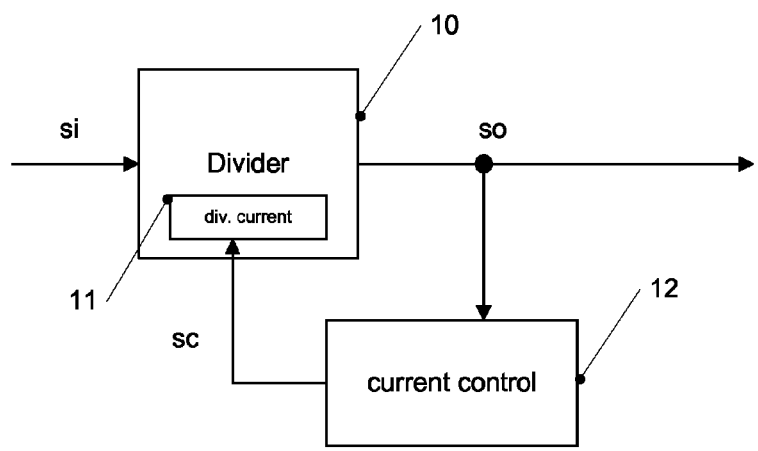
FIG. 1 is a block diagram of a divider circuit according to an embodiment.

Turning now to the figures, in FIG. 1, a block diagram of a divider circuit according to an embodiment is shown. The embodiment of FIG. 1 comprises a divider block 10 which comprises a frequency divider, for example a frequency divider implemented in current mode logic. Divider block 10 further comprises a divider current source 11 which provides the frequency divider with current. For example, divider current source 11 may couple circuitry of the frequency divider with a reference potential like ground. In some embodiments, divider current source 11 may comprise a plurality of individual current sources. In some embodiments, besides the frequency divider divider block 10 may comprise additional circuitry. For example, in some embodiments, divider block 10 may comprise a level shifter. In case the frequency divider is a CML frequency divider, such a level shifter may for example serve to convert CML logic levels to logic levels used in other technologies like in CMOS (complementary metal oxide semiconductor) technology, for example logic levels corresponding to VDD and VSS.

Divider block 10 is operable to receive an input signal si have a first frequency and in response thereto to output an output signal so having a second frequency. The second frequency corresponds to the first frequency divided by a divider factor of the frequency divider of divider block 10. The divider factor may be an adjustable divider factor or a fixed divider factor. The divider factor may be an integer value, for example 2, 3, 4 etc., but is not limited thereto. Output signal so may be used for various purposes, for example as a feedback signal in a phase-locked loop, as a clock signal etc.

Furthermore, output signal so is fed to a current control block 12. In response to output signal so, current control block 12 outputs a current control signal sc which controls a current output by divider current source 11.

In some embodiments, the current output by divider current source 11 may influence a duty cycle of signal so output by divider block 10. In such embodiments, current control block 12 may generate current control signal sc based on the duty cycle of output signal so to regulate the duty cycle of output signal so to a desired value. For example, to generate a current control signal sc based on the duty cycle of output signal so, current control circuit 12 may comprise a low pass filter and/or an integrator. Embodiments employing such techniques will be described later in more detail. In other embodiments, additionally or alternatively divider current source 11 may influence some other property of output signal so, and current control block 12 may generate current control signal sc such that this property of output signal so assumes a desired value.

Figure 2:
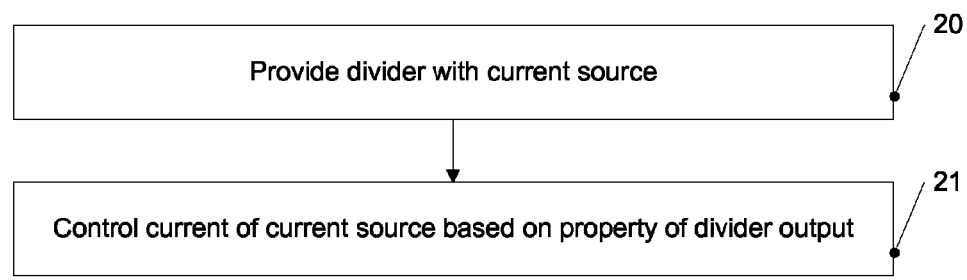
FIG. 2 is a flowchart illustrating a method according to an embodiment.

In FIG. 2, a method according to an embodiment is illustrated. The method of FIG. 2 may for example be implemented using the divider circuit of FIG. 1 discussed above or a divider circuit discussed below with reference to FIG. 3, but may also be implemented using other types of divider circuits or divider apparatuses.

At 20, a divider with an adjustable current source is provided, for example a CML divider. Adjusting the current source may change or adjust a property of an output signal of the frequency divider.

At 21, the current of the current source is controlled based on this property of the divider output signal. In some embodiments, the property may comprise a duty cycle. In some embodiments, the output of the frequency divider may be analyzed or processed to control the current of the current source. In other embodiments, a signal derived from the output of the frequency divider, for example a level-shifted version of the output, may be used as a basis for controlling the current of the current source.

Figure 3:
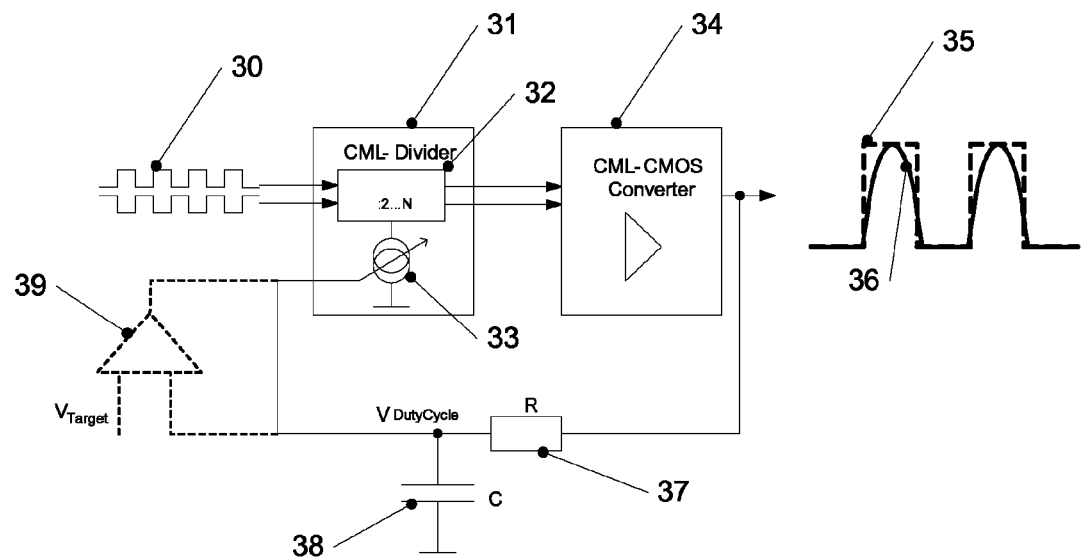
FIG. 3 is a more detailed block diagram of a divider circuit according to an embodiment.

In FIG. 3, a more detailed block diagram of a divider circuit according to a further embodiment is shown. The embodiment of FIG. 3 comprises a current mode logic (CML) frequency divider 31 which comprises a divider circuit 32. Divider circuit 32 is supplied by an adjustable current source 33. The current supplied by current source 33 is also referred to as bias current in some cases. Divider circuit 32 is configured to divide a differential input signal 30 by a divider factor, for example an integer divider factor like 2, 3, . . . , N. In response to receiving differential input signal 30, CML divider 31 outputs a differential output signal having a frequency corresponding to the frequency of input signal 30 divided by the divider factor.

Figure 4:
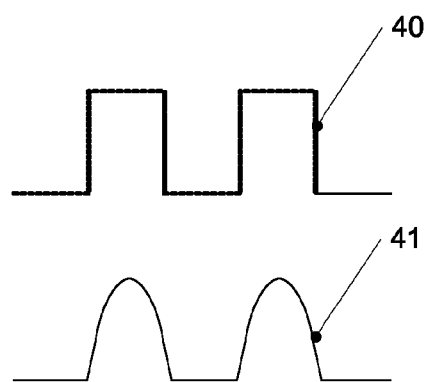
FIG. 4 is a diagram illustrating waveforms in some embodiments.

The differential output signal of CML divider 31 is fed to a CML-CMOS converter 34 which converts the logic levels of the signal output by CML divider 31 to a single-ended signal corresponding to CMOS logic levels and which may be implemented in any conventional manner. An "ideal" output signal of converter is labeled 35 in FIG. 3 and is shown in an enlarged manner in FIG. 4 and labeled 40. Due to various effects, in real cases the output signal may more resemble signal 36 of FIG. 3 or signal 41 in FIG. 4. Compared to the "ideal" case, signals 36 and 41 have a reduced duty cycle or, in other words, a reduced time where the level of the signal is at its maximum value. This, as can be seen in FIG. 3 and FIG. 4, in turn results in a reduced area below the curve which corresponds to an integral of the curve.

The output signal of CML-CMOS converter 34 may be used for various purposes, for example as feedback signal in a phase-locked loop in case for example signal 30 corresponds to an output signal of an oscillator of the phase-locked loop. Furthermore, the output signal of CML-CMOS converter 34 is fed to a low-pass filter depicted by a resistor 37 and a capacitor 38. Low-pass filter 37, 38 acts as an integrator. In other embodiments, other implementations of low-pass filters or integrators may be used.

An output signal of low-pass filter 37, 38 is labeled $V_{DutyCycle}$ in FIG. 3 and is a signal indicative of the area below the output signal 36, i.e. of the duty cycle of output signal 36. For example, a ratio between the integrated output signal and a supply voltage like VDD in case of CMOS levels may correspond to the duty cycle. Based on $V_{DutyCycle}$, current source 33 of CML divider 31 is controlled. For example, in some embodiments, $V_{DutyCycle}$ may for example be fed to a gate terminal of a transistor of adjustable current source 33. In other embodiments, $V_{DutyCycle}$ may be further processed before serving as a control signal.

For example, in some embodiments, as indicated by dashed lines in FIG. 3, $V_{DutyCycle}$ may be compared to a desired reference value $V_{Target}$ corresponding to a desired duty cycle using a comparator 39 or other comparator circuitry, and adjustable voltage source 33 may be controlled based on the comparison. This allows for a regulation of the duty cycle. For example, in some embodiments, a duty cycle of 50% may be desired, for example in case of a divider factor of 2. For this regulation, in some embodiments, it is used that for many implementations of CML dividers around an operation point of the CML divider there is a monotonous relationship between duty cycle and current generated by current source 33.

Figure 5:
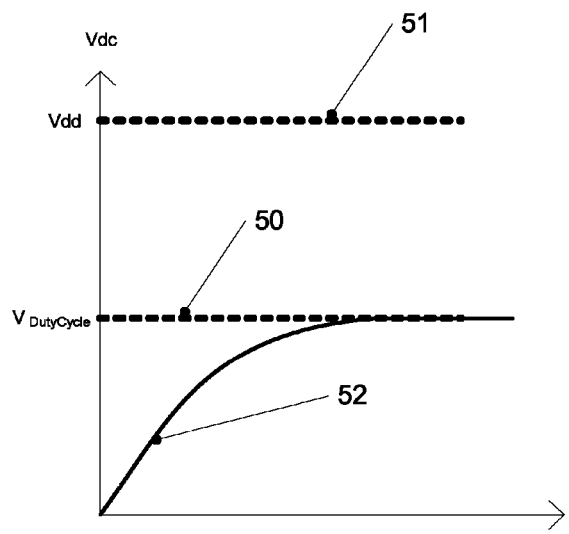
FIG. 5 is a diagram illustrating operation of some embodiments.

This may lead to a regulation behavior as schematically shown in FIG. 5. A line 51 in FIG. 5 shows a voltage VDD which may for example correspond to a logic 1 CMOS logic level. A desired value of the duty cycle, for example 50% or slightly below 50%, is shown by a horizontal line 50. A curve 52 shows an example for a regulation curve where through the regulation loop shown in FIG. 3 via low-pass filter 37, 38 $V_{DutyCycle}$ and therefore the duty cycle itself is regulated to a desired value.

In some embodiments, the desired value (for example corresponding to horizontal line 50 of FIG. 5) may be selected slightly below an "ideal" value, for example 40% or 45% instead of 50% for a divider factor of 2, to reduce current consumption. In other words, while the divider factor of 2 would correspond to a nominal target value for the duty cycle of 50% (or a divider factor of 3 to 33.3% etc.), in some embodiments the target value is chosen below to save current.

Figure 6:
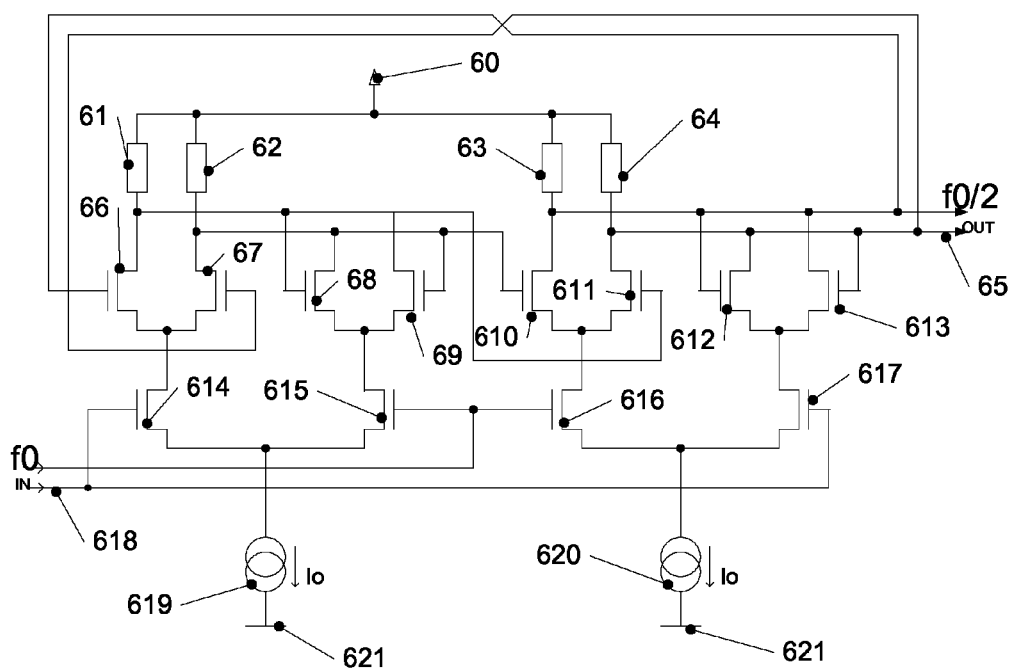
FIG. 6 is a circuit diagram of a frequency divider usable in some embodiments.

In FIG. 6, a circuit diagram illustrating an example for a CML divider usable for example in the embodiment of FIG. 3 or the embodiment of FIG. 1 is shown. The example of FIG. 6 shows a CML divider with a divider factor of 2. In other words, when a differential input signal having a frequency f0 is received at a differential input 618, nominally an output signal is output at a differential output 65 having half this frequency, i.e. f0/2. "Nominally" in this respect indicates that deviations from the ideal or nominal case may exist e.g. due to temperature variations, supply voltage variations or process variations.

It should be noted that the CML divider of FIG. 6 serves merely as an example, and other implementations, for example other conventional implementation of CML divider having a divider factor of 2 or any other divider factor, for example an integer factor different than 2, may be used. Also, other types of dividers than CML dividers which have a current source which influences a property of an output signal of the divider may be employed.

The example frequency divider of FIG. 6 comprises two current sources 619, 620 which are coupled between ground 621 and remaining circuit portions of the frequency divider as shown in FIG. 6.

The differential input signal is supplied to a first pair of input transistors 614, 615 and a second pair of input transistors 616, 617 as shown. Transistors 614 and 615 in some embodiments may have a different width/length (W/L) ratio than transistors 616, 617. In other embodiments, a current supplied by current source 620 may differ from a current supplied by current source 619.

Furthermore, transistors 66 to 613 are provided and coupled with the input transistors 614 to 617 and further coupled via loads, for example resistors, 61 to 64 with a positive supply voltage 60 as shown. Transistors 66 to 613 are also coupled with output 65 as shown.

As the general operation of the divider of FIG. 6 corresponds to the operation of a conventional CML frequency divider, it will not be discussed in more detail here. As already mentioned, also other conventional dividers, for example other conventional implementations of CML frequency dividers, may be used in embodiments like the embodiment of FIG. 3 or the embodiment of FIG. 1.

Figure 7:
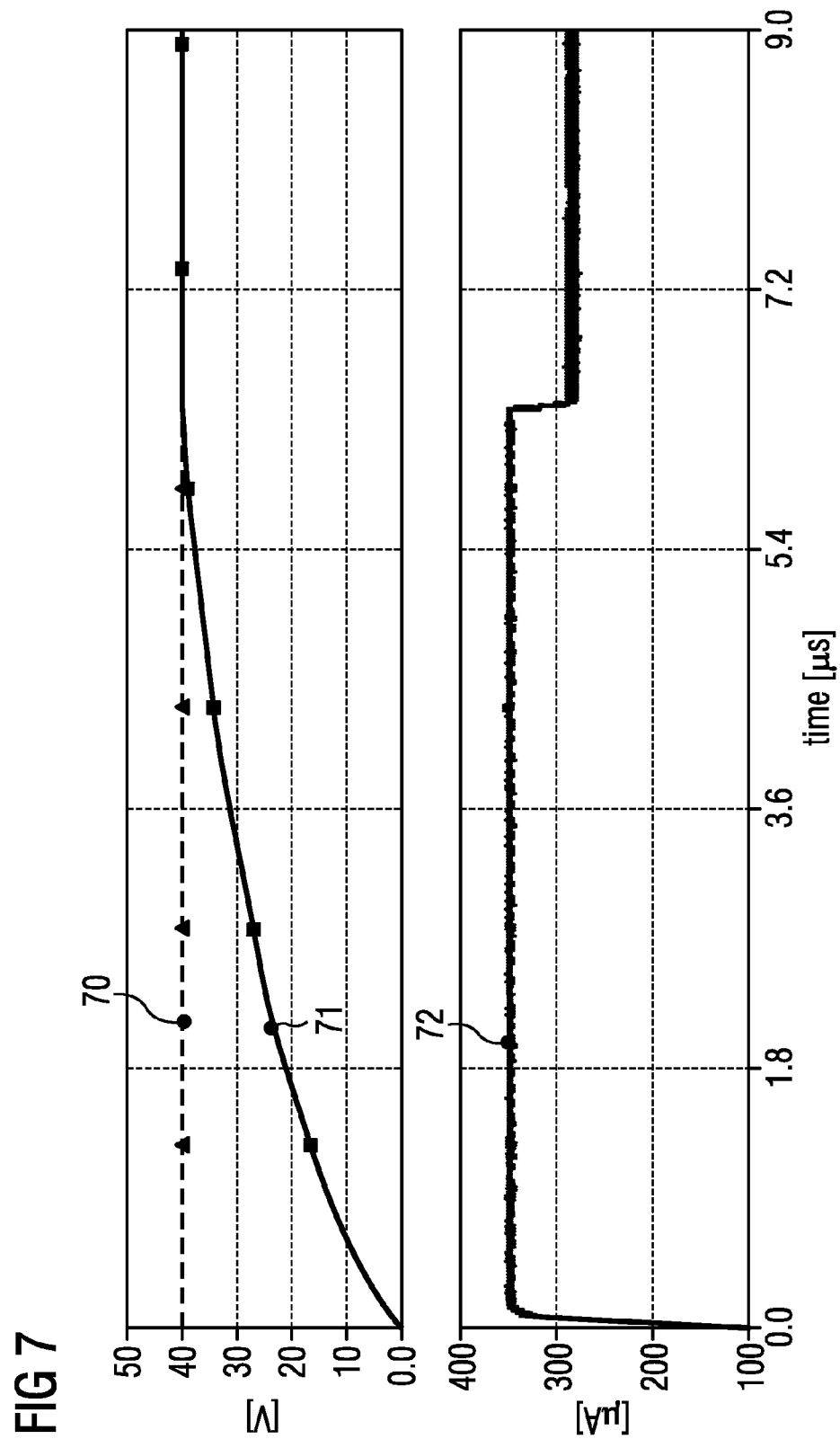
FIG. 7 includes graphs showing simulation results illustrating the operation of some embodiments.
Figure 8:
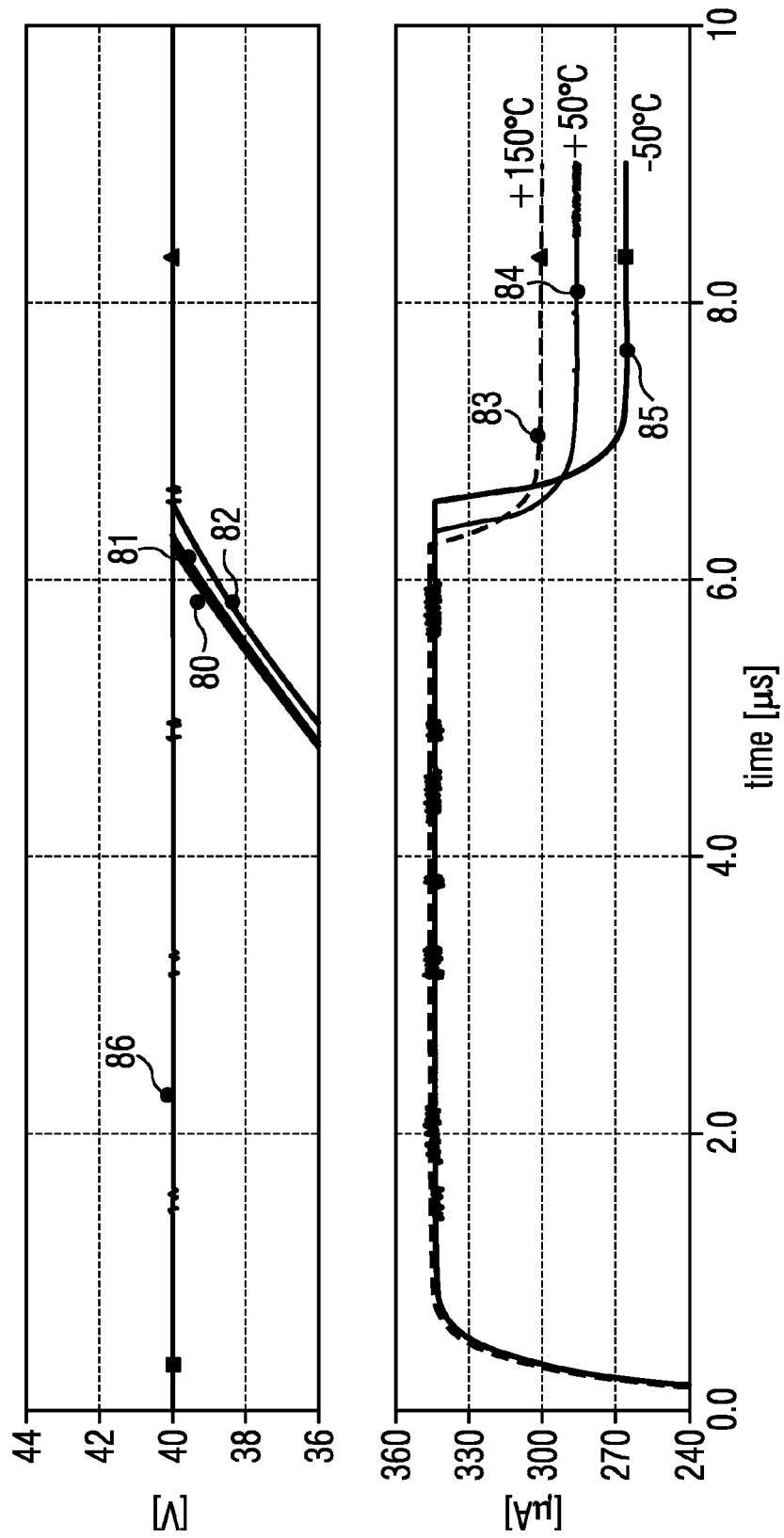
FIG. 8 includes graphs showing simulation results illustrating operation of some embodiments.

Next, with reference to FIGS. 7 and 8 various simulation results for the embodiment of FIG. 3 using for example a divider as shown in FIG. 6 will be presented. It is emphasized that any numerical values or forms of curves shown in the simulation results serve only for further illustration purposes, and in other implementation of embodiments different values and/or curves may result.

In an upper graph of FIG. 7, the voltage $V_{DutyCycle}$ over time is shown in a curve 71 in units of percent duty cycle. A horizontal curve 70 denotes the target value, in this case 40% duty cycle. In other embodiments, other values may be used. As can be seen, in the example of FIG. 7 the desired value as indicated by curve 70 is reached after about 6.5 µs time. In the lower graph, the current of the current source is shown. In this case, when the desired value is reached, the current consumption in the example drops from about 350 µA to 280 µA.

In FIG. 8, simulations corresponding to the simulation of FIG. 7 for various temperatures are shown. In the upper graph of FIG. 8, curves 80, 81 and 82 show the regulation behavior of $V_{DutyCycle}$ for temperatures of +150 C.°, +50 C.° and −50 C.°, respectively. Horizontal line 86 again shows a target value, in this case again 40%. The lower graph of FIG. 8 shows the behavior of the current consumption, curve 83 corresponding to a temperature of +150 C.°, curve 84 shows the behavior for +50 C.° and curve 85 shows the behavior for −50 C.°. While slight variations based on the temperature exist, it can be seen that the duty cycle of 40% is reached at slightly more than 6.0 µs for all cases, and the current in the regulated case, i.e. the case where the duty cycle reached the target value, varies between slightly below 207 µA and slightly above 300 µA depending on the temperature.

It is emphasized again that the above-described embodiments serve merely as examples, and variations and modifications are possible without departing from the scope of the present application.

What is claimed is:

1. An apparatus, comprising:
   a divider circuit, the divider circuit comprising a divider current source and being configured to receive an input signal having a first frequency and to output an output signal having a second frequency corresponding to the first frequency divided by a divider factor, wherein a current of the divider current source influences a property of said output signal, and a current control circuit configured to adjust a current of said divider current source based on said property of said output signal.

2. The apparatus of claim 1, wherein said property comprises a duty cycle.

3. The apparatus of claim 1, wherein said current control circuit is configured to regulate said property to a desired target value.

4. The apparatus of claim 3, wherein said target value is below a nominal value corresponding to the divider factor.

5. The apparatus of claim 1, wherein said divider circuit comprises a current mode logic divider.

6. The apparatus of claim 5, wherein said divider circuit further comprises a level shifter.

7. The apparatus of claim 1, wherein said current control circuit comprises a low-pass filter.

8. The apparatus of claim 1, wherein said current control circuit comprises an integrator.

9. An apparatus, comprising:
   a current mode logic divider configured to receive an input signal and to output a frequency divided output signal, a frequency of the output signal corresponding to a frequency of the input signal divided by a divider factor, the current mode logic divider comprising at least one adjustable bias current source, and
   a current control circuit configured to control a current of said bias current source depending on a duty cycle of the output signal.

10. The apparatus of claim 9, further comprising a level shifter coupled to receive said output signal and to output a level-shifted output signal,
    wherein the current control circuit is configured to control said adjustable current source based on the level-shifted output signal.

11. The apparatus of claim 10, wherein said level shifter is configured to shift said output signal to complementary metal oxide semiconductor (CMOS) logic levels.

12. The apparatus of claim 9, wherein said current control circuit comprises a low-pass filter.

13. The apparatus of claim 9, wherein said current control circuit comprises an integrator.

14. The apparatus of claim 9, wherein the current control circuit is configured to adjust said bias current source such that the duty cycle corresponds to a target duty cycle value.

15. The apparatus of claim 14, wherein the target duty cycle value is below a duty cycle value corresponding to the divider factor.

16. A method, comprising:
    providing a frequency divider, the frequency divider comprising a bias current source, and
    controlling a current of the bias current source based on a property of an output signal of said divider.

17. The method of claim 16, wherein said property comprises a duty cycle.

18. The method of claim 16, wherein said property comprises a measure of an integral of said output signal.

19. The method of claim 18, further comprising integrating said output signal.

20. The method of claim 16, wherein said regulating comprises regulating said current to adjust said property to a target value, said target value being below a nominal target value corresponding to a divider factor of said frequency divider.

* * * * *